United States Patent

[11] 3,579,227

[72] Inventor James W. Appelgren
Highland Park, Ill.
[21] Appl. No. 730,170
[22] Filed May 17, 1968
[45] Patented May 18, 1971
[73] Assignee The Louis Allis Company
Milwaukee, Wis.

[54] DIGITAL-TO-ANALOG CONVERTER SYSTEM
7 Claims, 3 Drawing Figs.

[52] U.S. Cl. 340/347
[51] Int. Cl. H03k 13/04
[50] Field of Search 340/347

[56] References Cited

UNITED STATES PATENTS

| | | | |
|---|---|---|---|
| 2,914,758 | 11/1959 | Retzinger | 340/347 |
| 2,931,025 | 3/1960 | Wolcott et al. | 340/347 |
| 3,310,799 | 3/1967 | Ohashi | 340/347 |
| 3,396,380 | 8/1968 | Ohashi | 340/347 |

*Primary Examiner*—Daryl W. Cook
*Assistant Examiner*—Gary R. Edwards
*Attorneys*—C. E. Martine, Jr., Alfred B. Levine, Alan C. Rose and Daniel D. Fatterley

ABSTRACT: The D/A converter system includes a positive D/A converter and a negative D/A converter having common outputs connected to ground. Logic circuitry provided for each D/A converter is responsive to a polarity control signal for disabling one D/A converter from producing an analog output signal of one polarity while enabling the other D/A converter to produce an analog output signal of the other polarity in response to a digital input signal from a digital controller. Power supplies bias the positive and negative D/A converters to isolate the analog output signal generated by the enabled D/A converter from the disabled D/A converter.

INVENTOR.
JAMES W. APPELGREN
BY
C.E. Martin Jr.
Attorney

INVENTOR.

JAMES W. APPELGREN

BY

C.E. Martine, Jr.

Attorney

DIGITAL-TO-ANALOG CONVERTER SYSTEM

BACKGROUND OF THE INVENTION

This invention relates to a system for converting a digital input signal to an analog output signal and, more particularly, relates to a system in which a logic circuit is used to selectively operate one of a pair of digital to analog (D/A) converters to generate an analog output signal having a selected polarity.

In control systems, it is customary to use a D/A converter as an interface between a digital controller and an analog drive. In some applications, the analog drive is used in regulating a controlled system, such as a workpiece positioning system, and error signals indicative of an out-of-position condition of the workpiece are processed by the digital controller to provide a digital input signal to the D/A converter. In such systems, the analog output signal produced by the D/A converter has the same polarity regardless of the position of the workpiece relative to zero. As a result, electromechanical switching devices, such as relays, have been used to mechanically reverse the polarity of the analog output signal. Because the operation of relays is slow relative to the microsecond polarity reversal speeds required in precision control systems, the slow operation of the relays offsets many of the advantages gained by the use of a digital control system.

SUMMARY OF THE INVENTION

Research has been conducted in an endeavor to provide a D/A converter system in which an analog output signal generated by a D/A converter has a polarity selected according to the polarity of an error in a controlled system. This research indicates that the provision of a logic circuit for selectively operating a pair of positive and negative D/A converters in response to a polarity control signal can be effective to provide an analog output signal having a selected polarity which can be substantially instantaneously reversed to precisely regulate a controlled system. It has also been found that by electrically isolating an enabled D/A converter from a disabled D/A converter, the outputs from the pair of D/A converters may be connected to a common, grounded output circuit.

In the present invention, rather than operating phase reversal circuitry, such as a relay, in response to a polarity control signal from a digital controller, logic circuitry responsive to the polarity control signal is provided for enabling one of the D/A converters and disabling the other D/A converter so that the output from the enabled D/A converter has the desired polarity. Because the logic circuitry substantially instantaneously responds to reversals in the polarity control signal, the polarity of the analog output signal may be reversed substantially instantaneously so that hunting is reduced to a minimum.

In addition, the D/A converter system of the present invention has an output which is connected to ground, whereas the output of prior systems utilizing dual D/A converters has not been grounded. As a result, prior systems have been used with more complex, hence more troublesome, amplification stages. On the other hand, the present D/A converter system can be used with single input amplifiers in which one side of the input signal must be tied to ground.

An object of the present invention is to provide a new and improved digital to analog converter system.

Another object of the present invention is to provide a system for converting a digital input signal to an analog output signal having a polarity selected according to the condition of a controlled system.

Still another object of the present invention is to provide a logic circuit for selectively rendering operative one of a pair of D/A converters to produce an analog output signal having a selected polarity.

A further object of the present invention resides in the provision of biasing circuits for isolating a first D/A converter from a second D/A converter having an output common to the first D/A converter.

BRIEF DESCRIPTION OF THE DRAWING

A complete understanding of the invention may be had be referring to the following detailed description and the accompanying drawings illustrating a preferred embodiment thereof, in which.

DESCRIPTION OF PREFERRED EMBODIMENT

Figures 1, 3:
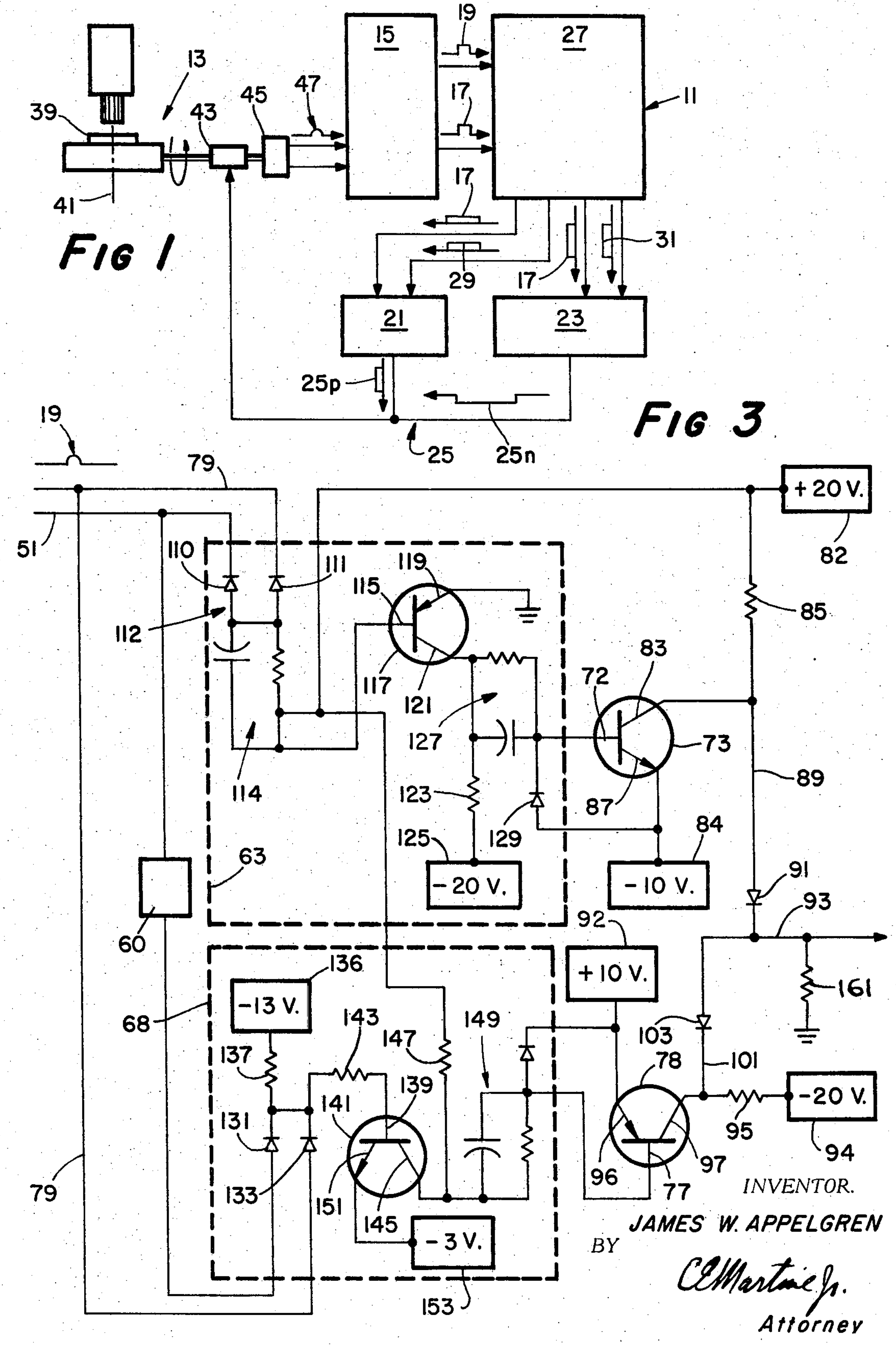
FIG. 1 is a block diagram of a system constructed according to the principles of the present invention showing a pair of positive and negative D/A circuits selectively controlled by a logic circuit.
FIG. 3 is a circuit diagram of a pair of logic networks for controlling the operation of one channel of the pair of D/A converters shown in FIG. 2.

Referring in general to FIG. 1 of the drawings, there is shown a digital to analog (D/A) control system 11, embodying the principles of the present invention, for controlling a physical system 13. The physical system 13 is monitored by a digital controller 15 to provide a digital output signal 17 and a polarity control signal 19. The digital signal 17 provides a digital input to a positive D/A converter 21 and to a negative D/A converter 23 for generating an analog output signal 25 having a selected polarity.

The polarity control signal 19 is conducted to a logic circuit 27 which senses the polarity condition of the signal 19 and produces in response thereto either a positive inhibit signal 29 or a negative inhibit signal 31. When the positive inhibit signal 29 is conducted to the positive D/A converter 21 to disable it from generating a positive analog output signal **25*p*, the logic circuit 27 enables the negative D/A converter 23 to generate a negative analog output signal 25*n*. When the polarity control signal 19 renders the logic circuit 27 effective to produce the negative inhibit signal 31, the signal 31 is fed to the negative D/A converter 23 to disable it from generating the negative analog output signal 25*n*, and the positive D/A converter is enabled to generate the positive analog output signal 25*p***.

Considering a particular embodiment, the physical system 13 may include a workpiece 39 which is to be positioned relative to a zero or reference point indicated by a line 41. A servo or drive motor 43 is responsive to the respective positive and negative analog output signals **25*p* and 25*n* for advancing the workpiece 39 to the zero line 41. A transducer 45 converts the rotary motion of the servo 43 to a digital signal 47 indicative of both the position of the workpiece 39 relative to the line 41 and which side, left or right, of the line 41 the workpiece 39 is located. The digital signal 47 is fed to the digital controller 15 which produces the digital input signal 17 and the polarity control signal 19**.

Assuming, for example, that the workpiece 39 was on the right side of the line 41 and that a positive analog output signal **25*p* returns the workpiece 39 to the line 41, the logic circuit 27 produces the negative inhibit signal 29 and renders the positive D/A circuit 21 effective to generate the positive analog output signal 25*p*. In response to the positive analog output signal 25*p*, the servo 43 returns the workpiece 39 to the line 41**.

In the event the workpiece 39 passes the line 41, the transducer 45 immediately senses this condition and, as described above, causes the negative analog output signal **25*n* to be generated. It may be understood then, that the system 11 is effective to substantially instantaneously reverse the polarity of the analog output signal 25 so that hunting of the workpiece 39 around the line 41** will be minimized.

Figure 2:
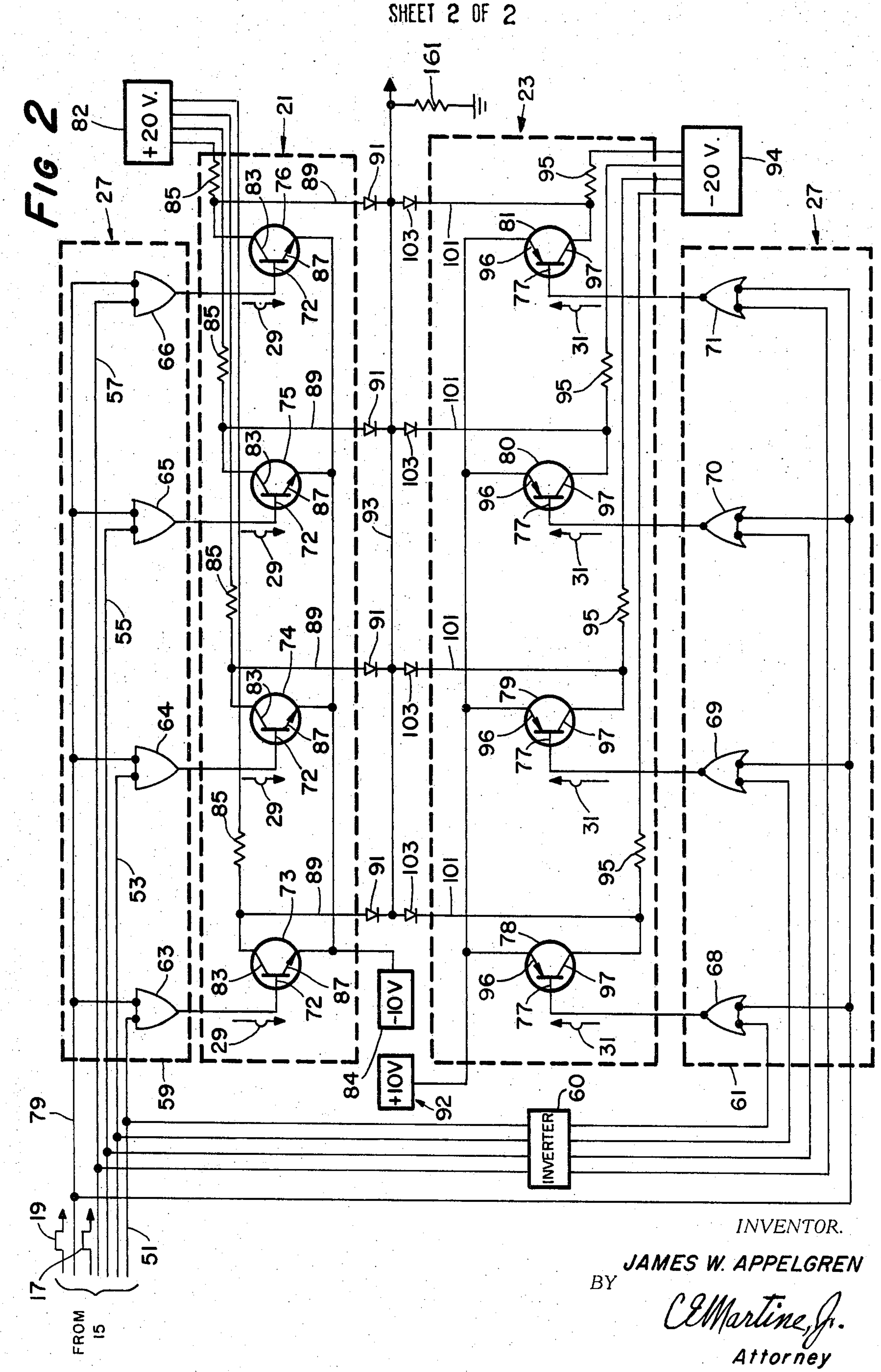
FIG. 2 is a schematic diagram of the logic circuit and the pair of D/A converters shown in FIG. 1 illustrating biasing circuits for isolating one D/A converter from the other.

Referring now to FIG. 2 for a detailed description of the present invention, a four-channel digital input signal 17 from the digital controller 15 is shown applied to first, second, third and fourth conductors 51, 53, 55 and 57, respectively, which are connected to first and second logic sections 59 and 61, respectively, of the logic circuit 27. The connection to logic section 61 is through inverter 60. Each of the logic sections 59 and 61 include four logic networks, networks 63, 64, 65 and 66 being provided for the section 59 and networks 68, 69, 70 and 71 being provided for the section 61. The four-channel digital input signal 17 represents one analog numeral which, for example, may be a units numeral. It is to be understood that if more than one analog numeral is desired, then additional four-channel digital inputs will be provided along with corresponding logic sections and D/A converters.

Each of the four digital input channels will carry either a logical 1 or a logical 0. Thus, a logical 1 in a first channel (corresponding to the first conductor 51) and a logical 0 in the other channels may represent the analog numeral 8, whereas logical 1 in the second channel (conductor 53) represents the analog numeral 4, a logical 1 in the third channel (conductor 55) represents the analog numeral 2, and a logical 1 in the fourth channel (conductor 57) represents the analog numeral 1. Thus, the logic networks 63 and 68 may be called the 8 networks, the networks 64 and 69 the 4 networks, the networks 65 and 70 the 2 networks, and the networks 66 and 71 the 1 networks.

For purposes of illustration, in the description of the circuits in FIGS. 2 and 3, a logical 0 will be represented by a −13 volt signal on any one of the four digital input channels and a logical 1 will be represented by a ground potential. Also, a positive analog output signal **25*p* will be generated in response to a ground potential polarity control signal 19 and a negative analog output signal 25*n* will be generated in response to a −13 volt polarity control signal 19**. These potentials have been selected for purposes of illustration, it being understood that different voltage values may be used in accordance with the principles of this invention.

As shown in FIG. 2, the polarity control signal 19 is applied to a conductor 79 which is connected to each of the networks 63—66. The signal 19 is also connected to the networks 68—71. The networks 63—66 are connected to the bases 72 of the respective positive analog output transistors 73, 74, 75 and 76 of the positive D/A converter 21 and the networks 68—71 are connected to bases 77 of respective negative analog output transistors 78—81 of the negative D/A converter 23. Considering the positive output transistor 73, a source 82 of 20 volt positive voltage, for example, is applied to a collector 83 across a weighting resistor 85 and an emitter 87 is connected to a source 84 of negative bias voltage, supplying −10 volts, for example. The transistors 74—76 are biased similarly and the values of resistance for the weighting resistors 85 are selected to set the level of the analog output signal 25 in proportion to the digital input signal 17 appearing on the four input conductors 51, 53, 55 and 57. Thus, for example, the weighting resistor 85 of the 8 channel will be one-eighth the resistance of the weighting resistor 85 of the 1 channel so that there will be an 8:1 ratio between the analog outputs from the 8 and 1 channels.

With a logical 0 input signal 17 applied to the logic networks 63—66, and with the −10 volt and +20 volt biases, the respective networks 63—66 turn the transistors 73—76 ON. With the transistors 73—76 ON, the −10 volt bias voltage is impressed by each of four conductors 89 on an output diode 91. The −10 volt bias voltage back biases the diodes 91 so that no output appears on a common output conductor 93.

Similarly, the negative analog output transistors 78—81 are normally ON when logical 0 input signal 17 appears in conductors 51, 53, 55 and 57. In particular, a positive bias voltage of 10 volts, for example, is impressed by a source 92 on an emitter 96 of the transistors 78—81 and a negative bias voltage of 20 volts, for example, from a source 94 is impressed across a weighting resistor 95 on a collector 97. The weighting resistors 95 are selected in the same manner as are the resistors 85 so that the resistance values thereof set the level of the analog output signal 25 in proportion to the digital input signal 17.

With these +10 and −20 volt biases and a logical 0 digital input signal 17, the logic networks 68—71 bias the bases 77 of the transistors 78—81 so that the transistors 78—81 are ON. With the transistors 78—81 ON, the +10 volt bias voltage is impressed by conductors 101 across output diodes 103. The positive voltage back biases the diodes 103 so that no output appears on the common output conductor 93.

Turning now to the logic networks 63 through 71 it will be appreciated that the basic function of the logic elements, taken in conjunction with the transistors of the D/A converters is to provide, responsive to certain combinations of input signal conditions, i.e. the logical state of the polarity control signal and the logical state of the digital input signal, the desired output from the D/A converter in output conductor 93. For example, to provide an analog output signal in conductor 93 of plus one (+1), it is necessary to provide the logic networks with both logical 1 polarity control signal 19 and logical 1 in the fourth channel (conductor 57) of the digital input signal 17. Under this combination of conditions, an output signal of plus one (+1) will be obtained in output conductor 93. If either of the above described input signal conditions are not present, the desired output signal will not be generated. Similarily, to provide an analog output signal in conductor 93 of minus one (−1), it is necessary to provide the logic networks with both a logical 0 polarity control signal and a logical 1 in the fourth channel (conductor 57) of digital input signal 17. In conventional designation, logic networks 63—66 perform the function of NAND gates and logic networks 68—71 perform the function of NOR gates.

Referring in detail to FIG. 3, the 8 logic networks 63 and 68 are shown connected to the respective positive and negative output transistors 73 and 78. In as much as the circuitry for the logic networks 64—66 and 69—71 is similar to that shown in FIG. 3 for the logic networks 63 and 68, only the details of the latter networks are discussed in detail below.

The logic network 63 includes a pair of controlled diodes 110 and 111 which are connected in parallel. While, because of the electrical signal voltage levels selected to represent the two logic states of the input signals to the logic networks, the parallel connection of the two diodes may technically be considered a OR type circuit, it is more convenient for purposes of explanation to define it as AND circuit. The AND circuit 112 is connected to a R-C network 114 in series with a base 115 of a PNP control transistor 117. The network is also connected to a +20 volt supply 82. An emitter 119 of the transistor 117 is connected to ground and a collector 121 thereof is connected across a biasing resistor 123 to a −20 volt source 125. The collector 121 is also connected across a R-C network 127 to the base 72 of the output transistor 73. The network 127 is also connected across a diode 129 to −10 volt source 131.

In response to a ground potential polarity control signal 19, i.e. logical 1, which is required for the generation of the positive analog output signal **25*p*, and in response to a logical 1 in conductor 51 the diodes 110 and 11 conduct and raise the bias applied to the base 115 so that the transistor 117 is turned OFF causing negative voltage from source 25 to be applied to the collector 121 thereof. Since negative voltage signals have been assigned a logical 0 state, the combination of AND circuit 112 and transistor 117 in logic network 63 provides a NOT AND or NAND function in which first and second logical 1 output signals to diodes 110 and 111 provide a logical 0 output at collector 121. With transistor 117 OFF, the base of the output transistor goes negative so that the transistor 73 is turned OFF. In this situation, the transistor 73 is in condition to generate the positive analog control signal 25*p* an output conductor 93**.

However, if the digital input signal 17 is a logical 0 for the 8 channel, then a −13 volt potential will be applied by the conductor 51 to the diode 110. The negative 13 volt potential drives the base 115 negative so that the transistor 117 turns ON and causes the transistor 73 to turn ON. With the transistor 73 ON, no output appears across the diode 91.

Considering the logic network 68, there is shown in FIG. 3 a pair of control diodes 131 and 133 which are connected to form an OR circuit 135. The circuit 135 is connected to a source 136 of −13 volt potential across a resistor 137 and to a base 139 of an NPN transistor 141 across a resistor 143. A collector 145 of the transistor 141 is connected across a resistor 147 to the +20 volt source 82. The collector 145 is also connected across an R–C network 149 to the base 77 of the transistor 78. An emitter 151 is connected to a −3 volt supply 153.

In response to a ground potential (logical 1) polarity control signal 19 calling for a positive analog output signal applied to the diode 133, the base 139 becomes positive relative to the −3 volt bias on the emitter 151, the transistor 141 turns ON and turns ON the transistor 78. With the transistor 78 turned ON, no analog output signal 25 will appear across the diode 103. Because base 139 is positive, a −13 volt digital input from the logical 8 channel applied to the diode 131 will not be effective to turn the transistor 145 OFF.

In the operation of the control system 11, the digital controller 15 provides the polarity control signal 19 and the four-channel digital input signal 17. The polarity control signal 19 is conducted along the conductor 79 to the logic networks 63—66 and 68—71. When a negative analog output signal **25*n* is desired, the polarity control signal 19 has a magnitude of −13 volts, i.e. logical state of 0. The −13 volt signal 19 renders the logic networks 63—66 effective to generate the positive inhibit signals 29 (FIG. 2) which are applied to the bases 72 of the positive output transistors 73—76 to maintain the transistors 73—76 ON. With the transistors 73—76 ON, no positive analog output signal 25*p* will appear on the conductor 93**.

In addition, the −13 volt (logical 0) polarity control signal 19 is applied to the logic networks 68—71. With the positive output transistors 73—76 maintained in an ON condition, the positive D/A converter 21 is disabled and is thus ineffective to respond to the digital input signal 17, whereas the 13 volt polarity control signal 19 renders the negative D/A converter 23 in condition to respond to the digital input signal 17. Assuming the digital input signal 17 represents the analog numeral 8, the conductor 51 will carry the logical 1, and the conductors 53, 55 and 57 will carry the logical 0. The logical 1 signal state in conductor 51 is inverted by inverter 60 to the logical 0 signal state so that diodes 131 and 133 both receive logical 0 input signals. The −13 volts which these logical 0 input signals represent bias transistor 141 off, raising the voltage at the collector 145 and the output voltage of the transistor so that the signal state of the output resembles that of logical 1. A logic element which provides a logical 1 output only when all the inputs are logical 0 is termed a NOT OR or NOR circuit and logic network 68 is so defined herein.

The raised voltage at the output of transistor 141 turns OFF negative transistor 78. With the negative output transistor 78 OFF, the output diode 103 connected to the collector 97 sees an output voltage from the −20 volt source 94 impressed across the weighting resistor 95 of the negative analog output transistor 78. The output voltage forward biases the diode 103 so that the negative analog output signal **25*n* is conducted from ground across an output resistor 161, and through the diode 103 and the resistor 95 to the source 94**.

It may be appreciated that in conventional D/A converter circuits, the emitters 87 of the positive output transistors 73—76 would be biased by a connection to ground. Thus, when the transistors 73—76 are ON, the diodes 91 would not be reverse biased, as in the present invention, but would see ground potential. Accordingly, if such ground bias were used in the present invention, no analog output signal would appear on the conductor 93 because the diodes 91 would conduct from ground, through the respective transistors and across the weighting resistors 95 to the −20 volt supply. However, in the present invention, because the source 84 applies the −10 volt back biasing potential to the diodes 91 and because the combination of the weighting resistors 95 and the output resistor 161 causes a voltage greater (more positive) than −10 volts to be impressed across the diodes 103, the diodes 91 will not conduct. As a result, the positive D/A converter 21 is effectively isolated from the negative D/A converter 23 even though the two share a common output conductor 93.

With the positive D/A converter 21 isolated from the negative D/A converter 23, and with the negative analog output signal **25*n* generated from the 8 channel, the analog output signal 25*n* represents the analog numeral 8** and has a negative polarity.

Assume now, for purposes of illustration, that it is desired to make a substantially instantaneous change in the analog output signal to a value of plus one (+1). In this situation, the digital controller 15 substantially instantaneously provides a polarity control signal 19 of ground potential and a logical 0 digital input signal 17, represented by a −13 volt potential on the conductors 51, 53 and 55 and a logical 1 ground potential on the conductor 57. The ground potential polarity control signal 19 causes the logic networks 68—71 to disable the negative D/A converter 23 by turning the transistor 78 ON and maintaining the transistors 79—81 ON. In response to the ground potential polarity control signal 19, the logic networks 63—66 enable the transistors 73—76 by turning such transistors OFF.

With the transistors 78—81 maintained ON, no negative analog output signal **25*n* will appear across the diodes 103. In response to the −13 volt potentials carried by the conductors 51, 53 and 55, the respective logic networks 63—65 turn the transistors 73—75 ON so that no analog output signal representative of the 8, 4 and 2 analog numerals will be generated. The ground potential digital input signal 17 carried by the conductor 57 is applied to the logic network 66. The logic network 66 maintains the positive output transistor 76 OFF so that voltage from the +20 volt source 82 across the weighting resistor 85 is applied across the diode 91 connected to the collector 83 of the transistor 76. This voltage is effective to generate the positive analog output signal 25*p* which is applied along the output conductor 93. The positive analog output signal 25*p* is isolated from the negative D/A converter 23 because the diodes 103 are back biased by the +10 volt potential, which is greater (more positive) than the positive analog output signal 25*p***.

It should be understood, of course, that the foregoing relates to only a preferred embodiment of the invention and that numerous modifications and alterations may be made therein without departing from the spirit and scope of the invention as set forth in the appended claims.

I claim:

1. A D/A converter system, which comprises:

a first means for converting a digital input signal into a first analog voltage output signal having a selected polarity with respect to ground;

a second means for converting a digital input signal into a second analog voltage output signal having the other polarity with respect to ground, said first and second means being connected to a common grounded output circuit;

logic means coupled to said first and second converting means for disabling said first means and for enabling said second means to generate said second analog voltage output signal; and voltage responsive means interposed in the output of said first converting means for isolating said second converting means from said first converting means to permit said second analog voltage output signal to pass to said common output circuit.

2. A D/A converter system according to claim 1 wherein said isolation means comprises a diode connected between said first converting means and said output circuit and poled to conduct said first analog voltage output signal, said isolating means further comprising a bias means coupled to said diode for applying bias voltage thereto for biasing said diode against conduction.

3. A D/A converter system according to claim 2 further comprising a means for limiting the level of said second analog voltage output signal to a level sufficient, with respect to the bias voltage applied to said diode by said bias means, as to maintain said diode nonconductive, so that said second analog voltage output signal passes to said common output circuit.

4. A D/A converter system for converting a digital input signal to a system analog voltage output signal having a first or second polarity with respect to ground responsive to a bistate polarity control signal, the state of which is indicative of the desired polarity of the system analog voltage output signal, said system comprising;

a first D/A converter for generating a first analog voltage output signal having a first polarity with respect to ground;

a second D/A converter for generating a second analog voltage output signal having a second polarity with respect to ground;

said first and second D/A converters being connected across diodes to a common grounded output circuit in which said system analog voltage output signal appears, said diodes being poled to conduct the analog voltage output signal from the D/A converter to which they are connected;

logic means coupled to said first and second converter means, said logic means being operable by the state of the polarity control signal for disabling said first converter and enabling said second converter responsive to a signal state indicative of said second polarity system analog output signal, said logic means being further operable by said digital input signal to render said second D/A converter effective to generate said second polarity analog output signal; and means coupled to said diode connected to said first D/A converter for applying a bias voltage thereto for biasing the diode against conduction.

5. A D/A converter system according to claim 4 further comprising a means for limiting the level of said second analog voltage output signal to a level sufficient, with respect to the bias voltage applied to said first D/A converter diode by said bias means, as to maintain said diode nonconductive, so that second analog voltage output signal passes to said common output circuit.

6. A D/A converter system according to claim 4 further including means for substantially instantaneously changing the state of said polarity control signal to a state indicative of the opposite polarity, said logic means being responsive to said changed polarity control for substantially instantaneously disabling said converter and enabling said first converter.

7. A system for converting a digital input signal to a system analog voltage output signal having a positive and a negative polarity with respect to ground, wherein the digital input signal has a logical 1 state and a logical 0 state for a given digital channel, said system comprising:

a grounded system analog output circuit for providing said system analog voltage output signal;

a first D/A converter for generating a positive analog output voltage signal, said converter including a first transistor having an output circuit and an input circuit for controlling the ON-OFF state of said output circuit, and means for biasing the input circuit thereof to place the output circuit of said first transistor in an ON state to prevent generation of a positive analog output voltage signal;

a first output diode connected between said first transistor output circuit and said system analog output circuit;

means connected to the output circuit of said first transistor for applying a diode control signal having a selected level with respect to the system analog voltage output signal for rendering said diode nonconductive to isolate said first D/A converter from said system analog output circuit;

a second D/A converter for generating a negative analog output voltage signal, said converter including a second transistor having an output circuit and an input circuit for controlling the ON-OFF state of said output circuit, and means for biasing the input circuit thereof to place said output circuit in the ON state to prevent generation of a negative analog output voltage signal;

means for producing a polarity control signal;

a logic circuit coupled to the input circuit of said first transistor and to said polarity control signal means and responsive to said polarity control signal for maintaining the output circuit of said first transistor in the ON state to prevent generation of said positive analog output signal;

a logic circuit to the input circuit of said second transistor and said polarity control signal means and responsive to said polarity control signal and to the digital input signal having a logical 1 state for placing the output circuit of said second transistor in the OFF state to enable said D/A converter to generate said negative analog output signal;

a second output diode connected between said second transistor output circuit and said system analog output circuit;

analog biasing means connected to the output circuit of said second transistor for forwardly biasing said second diode to apply said negative analog output signal to said system analog output circuit; and means for limiting said negative analog output signal to a level less than said selected level of said diode control signal so that said diode control signal is effective to maintain said first diode back biased during the generation of said negative analog output signal.